(12) United States Patent
Poduval et al.

(10) Patent No.: US 11,888,478 B2
(45) Date of Patent: Jan. 30, 2024

(54) METHODS AND APPARATUS TO PERFORM CML-TO-CMOS DESERIALIZATION

(71) Applicant: Texas Instruments Incorporated, Dallas, TX (US)

(72) Inventors: Nithin Sathisan Poduval, Sunnyvale, CA (US); Abishek Manian, San Jose, CA (US); Roland Nii Ofei Ribeiro, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 18 days.

(21) Appl. No.: 17/515,034

(22) Filed: Oct. 29, 2021

(65) Prior Publication Data

US 2023/0135422 A1 May 4, 2023

(51) Int. Cl.
*H03K 19/0185* (2006.01)
*H03K 3/037* (2006.01)

(52) U.S. Cl.
CPC ..... *H03K 19/018521* (2013.01); *H03K 3/037* (2013.01)

(58) Field of Classification Search
CPC ........... H03K 19/0175; H03K 19/0185; H03K 19/018521; H03K 3/02; H03K 3/027; H03K 3/037
See application file for complete search history.

(56) References Cited

U.S. PATENT DOCUMENTS

| | | | | |
|---|---|---|---|---|
| 9,966,964 | B1* | 5/2018 | Meninger | H03L 7/18 |
| 11,528,016 | B2* | 12/2022 | Heshami | H03K 3/356139 |
| 2002/0171453 | A1* | 11/2002 | Kanamori | H03K 3/356139 |
| | | | | 327/57 |
| 2003/0201800 | A1* | 10/2003 | Matsuo | H03K 3/356139 |
| | | | | 327/57 |
| 2008/0250285 | A1* | 10/2008 | Pacha | G01R 31/318552 |
| | | | | 714/726 |
| 2015/0029876 | A1* | 1/2015 | Ogata | H04L 25/028 |
| | | | | 370/252 |
| 2017/0329363 | A1* | 11/2017 | Mangalindan | G06F 13/4282 |
| 2018/0322086 | A1* | 11/2018 | Tailliet | G06F 13/4059 |
| 2020/0105319 | A1* | 4/2020 | Mostofa | G11C 7/1087 |
| 2021/0091768 | A1* | 3/2021 | Kano | H03K 23/00 |
| 2023/0135422 | A1* | 5/2023 | Poduval | H03K 19/018521 |
| | | | | 326/68 |

* cited by examiner

*Primary Examiner* — Jason M Crawford
(74) *Attorney, Agent, or Firm* — Valerie M. Davis; Frank D. Cimino

(57) ABSTRACT

An example apparatus includes: a first level shifting circuit including a supply output; a first deserializer stage including a supply input, a first input, a first output, and a second output, the supply input coupled to the supply output; a second level shifting circuit including a second input and a third output, the second input coupled to the first output; and a second deserializer stage including a third input, a fourth output and a fifth output, the third input coupled to the third output.

6 Claims, 4 Drawing Sheets

METHODS AND APPARATUS TO PERFORM CML-TO-CMOS DESERIALIZATION

TECHNICAL FIELD

This description relates generally to deserialization, and more particularly to methods and apparatus for current-mode logic to complementary metal-oxide-semiconductor (CML-to-CMOS) deserialization.

BACKGROUND

In high-speed serial links, data is transmitted through a link or channel before it is deserialized or demultiplexed into multiple lower-speed parallel data streams for further digital signal processing. Deserializers convert a single data stream to multiple parallel data streams. The data received by the deserializer is typically formatted as a current-mode logic (CML) data stream. CML operation is efficient at increased data rates, whereas complementary metal-oxide-semiconductor (CMOS) operation is efficient at reduced data rates.

SUMMARY

For methods and apparatus to perform CML-to-CMOS deserialization, an example CML-to-CMOS deserializer includes a first level shifting circuit including a first level shifting circuit including a supply output; a first deserializer stage including a supply input, a first input, a first output, and a second output, the supply input coupled to the supply output; a second level shifting circuit including a second input and a third output, the second input coupled to the first output; and a second deserializer stage including a third input, a fourth output and a fifth output, the third input coupled to the third output.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
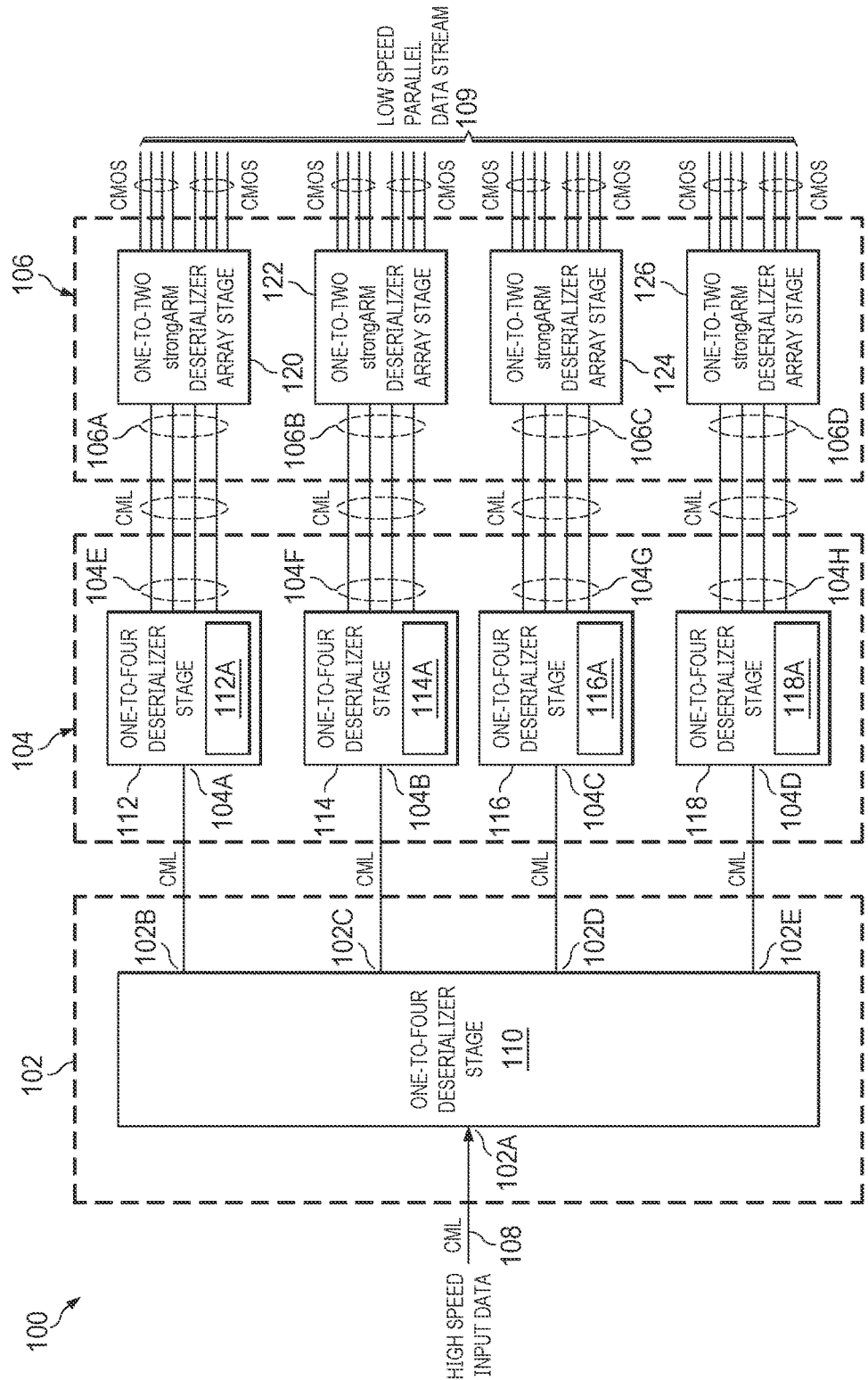
FIG. 1 is a block diagram of an example CML-to-CMOS deserializer.

The drawings are not necessarily to scale.

In high-speed serial links, data is transmitted through a link or channel before it is deserialized or demultiplexed into multiple lower-speed parallel data streams. A deserializer may be configured to convert a single data stream (e.g., a serial data stream) into a plurality of data streams (e.g., a plurality of parallel data streams). Typically, a deserializer converts the input data stream into the desired amount of data streams in a series of stages. A deserializer stage is circuitry configured to convert one or more data streams into a plurality of data streams and/or changing the logic operation (e.g., CML-to-CMOS). For example, a deserializer designed to convert one data stream into 32 parallel data streams (e.g., a 1:32 deserializer) may include of a first stage to convert one stream into four streams, a second stage to convert four data streams to 16 data streams, and a third stage to convert 16 data streams into 32 data streams.

A conventional deserializer stage includes a plurality of CML latches to sample and deserialize the data streams. For example, a one-to-two deserializer stage including D-Latches requires a data stream, a clock signal, and a complementary clock signal (e.g., an inverted version of the clock signal, 180 degrees out of phase of the clock signal, etc.). Some applications may configure a plurality of D-Latches to perform as a D-flip flop. A first D-flip flop including a first D-Latch and a second D-Latch may sample the data stream on the rising edge of the clock. A second D-flip flop including a third D-Latch and a fourth D-Latch may sample the data stream on the falling edge of the clock. A fifth D-Latch would sample the output of the first D-flip flop, such that the output of the deserializer stage would be produced at the same time on the output of the fourth and fifth D-Latch (e.g., two parallel data streams).

The data received by the deserializer is typically operating with CML. CML operation is typically used during data transmission based on CML operation being more power efficient at higher data rates than CMOS operation. CMOS operation is typically used during digital signal processing as the result of CMOS operation being more efficient at reduced data rates than CML operation. Some applications deserialize a CML signal into parallel CML data streams before individually converting each data stream to CMOS. A separate CML-to-CMOS converter is typically used by each parallel data stream. Additionally, the area and power consumption of a deserializer increase as the result of the plurality of CML-to-CMOS converters.

The example CML-to-CMOS deserializer described herein, includes circuitry to deserialize a CML data stream in a plurality of stages. The CML-to-CMOS deserializer further including a final stage that performs a one-to-two deserialization in addition to preforming a CML-to-CMOS conversion. The combination of the CML-to-CMOS conversion and the final one-to-two deserialization stage, reduces the power consumption and the area of the deserializer. The input of the final stage may be configured to a lower common mode voltage, such that the stage prior to the final stage (e.g., the flip flop including level shifting circuitry of FIG. 3) of the CML-to-CMOS deserializer may implement level shifting circuitry. The final stage of the CML-to-CMOS deserializer implements a configuration of latches (e.g., as the CML-to-CMOS deserializer stage of FIG. 2 implementing a plurality of the CML-to-CMOS latch including input level shifters of FIG. 4) to convert a single CML data stream into two CMOS data streams.

The CML-to-CMOS deserializer additionally includes circuitry to accommodate for the input common mode requirements of the strongARM latch. The strongARM latch operates under approximately 1.2 volts opposed to the CML deserialization stages operating under approximately 2.5 volts. As shown in detail in the examples of FIG. 3, the CML-to-CMOS deserializer includes resistance between the voltage supply and the D-Latches used in the second to final stage in order to reduce the output common mode level. The CML-to-CMOS deserializer implements source follower-based level shifters to further reduce the input common mode level of the strongARM latch within the final stage. The combination of the level shifting in the final two stages of the CML-to-CMOS deserializer lower the common mode level to enable the final stage to include strongARM latches configured to deserialize and convert from CML-to-CMOS.

FIG. 1 is a block diagram of an example CML-to-CMOS deserializer 100. In the example of FIG. 1, the CML-to-CMOS deserializer 100 includes an example stage 102, an example 4:16 deserializer stage 104, and an example 16:32 deserializer stage 106. In the example of FIG. 1, the CML-to-CMOS deserializer 100 converts a first example CML data input stream received at an input 108 into 32 parallel CMOS data streams at outputs 109. Alternatively, the CML-to-CMOS deserializer 100 may include any number of stages to convert a single CML data stream into a plurality of CMOS data streams.

In the example of FIG. 1, the stage 102 includes an example first one-to-four deserializer stage 110. A CML data stream received at the input 108 is coupled to an input 102A of the first one-to-four deserializer stage 110. The first one-to-four deserializer stage 110 converts the CML data stream received at the input 108 into four parallel CML data streams that are provided at outputs 102B-102E.

In the example of FIG. 1, the 4:16 deserializer stage 104 includes a second one-to-four deserializer stage 112, a third one-to-four deserializer stage 114, a fourth one-to-four deserializer stage 116, and a fifth one-to-four deserializer stage 118. The one-to-four deserializer stages 112-118 are configured to each convert a single CML data stream that are provided to inputs 104A-104D into four CML data streams that are provided to outputs 104E-104H. The one-to-four deserializer stages 112-118 are each coupled to a separate output of the first one-to-four deserializer stage 110. The one-to-four-deserializer stages 112-118 may include a resistor circuit (a resistor between voltage source VDD and the voltage supply of the stage) 112A, 114A, 116A, and 118A between voltage supply of the stage 102 and the voltage supply input of the circuitry implemented in the deserialization process, such that the common mode level of the output of each one-to-four deserializer stage may be adjusted. The one-to-four deserializer stages 112-118 include four CML data stream inputs and generate 16 CML data stream outputs, such that each CML data stream output includes lowered common mode level.

In the example of FIG. 1, the 16:32 deserializer stage 106 includes an example first one-to-two strongARM deserializer array stage 120, a second one-to-two strongARM deserializer array stage 122, a third one-to-two strongARM deserializer array stage 124, and a fourth one-to-two strongARM deserializer array stage 126. The one-to-two strongARM deserializer array stages 120-126 each convert four CML data streams received at inputs 106A-106D into eight CMOS data stream at outputs 109. The one-to-two strongARM deserializer array stages 120-126 are individually coupled to one of the one-to-four deserializer stages 112-118. The one-to-two strongARM deserializer array stages 120-126 convert 16 CML data streams received at the inputs 106A-106D into 32 CMOS data stream at the outputs 109.

In some examples, the CML-to-CMOS deserializer 100 is a single integrated circuit (IC) (such as circuitry implemented on a single semiconductor die or on multiple die but within a single IC package). For example, the stage 102 and the 4:16 deserializer stage 104 may be included on the same semiconductor die. In some examples, the CML-to-CMOS deserializer 100 may be implemented by two or more ICs in a single IC package to implement a multi-chip module (MCM). In some examples, the low power CML-to-CMOS deserializer 100 may be implemented by two or more ICs (such as two or more IC packages). For example, the stage 102 and the 4:16 deserializer stage 104 may be on a first die and the 16:32 deserializer stage 106 may be on a second die. In some examples, the stage 102 may be on a first die, the 4:16 deserializer stage 104 may be on a second die, and the 16:32 deserializer stage 106 may be on a third die. Alternatively, one or more hardware circuit components (such as the second one-to-four deserializer stage 112, the third one-to-four deserializer stage 114, etc.) of the 4:16 deserializer stage 104 may be included in the stage 102. Alternatively, one or more hardware circuit components (such as the first one-to-two strongARM deserializer array stage 120, the second one-to-two strongARM deserializer array stage 122, etc.) of the 16:32 deserializer stage 106 may be included in the 4:16 deserializer stage 104.

In example operation, the stage 102 converts the CML data stream received at the input 108 into four CML data streams at the outputs 102B-102E using the first one-to-four deserializer stage 110. The outputs 102B-102E are configured to be the result of sampling the data stream 4 times per an example clock cycle, such that each output represents the data during a quarter of the clock cycle. The outputs 102B-102E may be configured to sequentially represent the input 108, such that the output 102B represents the input 108 during a first quarter of the clock cycle, the output 102C represents the input 108 during the second quarter of the clock cycle, the output 102D represents the input 108 during the third quarter of the clock cycle, and the output 102E represents the input 108 during the final quarter of the clock cycle. The 4:16 deserializer stage 104 converts the four CML data streams received at the inputs 104A-104D into 16 CML data streams at the outputs 104E-104H using the one-to-four deserializer stages 112-118. The 4:16 deserializer stage 104 may additionally use the resistor circuits 112A, 114A, 116A, and 118A, between voltage supply and the D-Latches of the one-to-four deserializer stages 112-118 to reduce the voltage supplied to the D-Latches comprising the one-to-four deserializer stages 112-118. The 16:32 deserializer stage 106 converts the 16 CML data streams received at the inputs 106A-106D into 32 CMOS data streams at the outputs 109 using the one-to-two strongARM deserializer array stages 120-126. Alternatively, the one-to-two strongARM deserializer array stages 120-126 may include additional circuitry to level shift the voltage of the inputs to accommodate for the input common mode requirement of a strongARM latch.

Advantageously, the CML-to-CMOS deserializer 100 converts the CML data stream received at the input 108 into 32 parallel CMOS data streams at the outputs 109. Advantageously, during the final stage (e.g., the 16:32 deserializer stage 106) a CML-to-CMOS conversion is performed in addition to a one to two deserialization. Advantageously, each data stream at the outputs 109 do not need a separate CML-to-CMOS converter.

Figure 2:
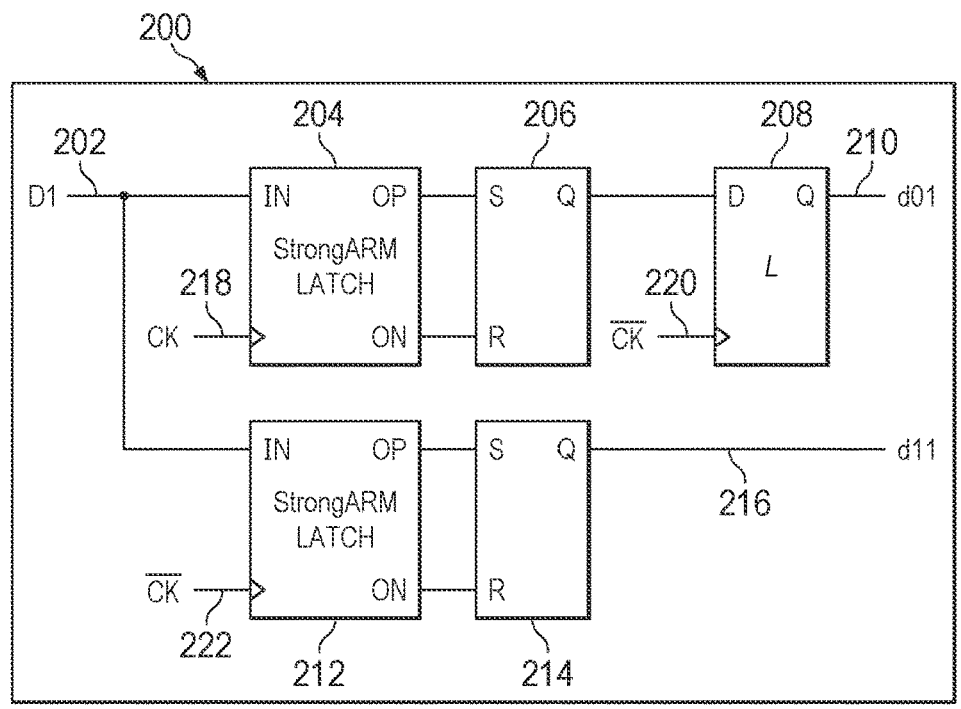
FIG. 2 is a schematic diagram of an example CML-to-CMOS deserializer stage.

FIG. 2 is a schematic diagram of an example one-to-two strongARM deserializer stage 200, which may be used to implement one or all the one-to-two strongARM deserializer stages 120-126 of FIG. 1. The one-to-two strongARM deserializer stage 200 converts one CML data stream (such as 106, for example) into two parallel CMOS data streams (such as the outputs of stage 120, for example). The one-to-two strongARM deserializer array stages 120-126 each include four instances of the one-to-two strongARM deserializer stage 200. In the example of FIG. 2, the one-to-two strongARM deserializer stage 200 includes an example first terminal 202, a first strongARM latch 204, a first SR-Latch 206, a D-Latch 208, a second terminal 210, a second strongARM latch 212, a second SR-Latch 214, a third terminal 216, a fourth terminal 218, a fifth terminal 220, and a sixth terminal 222. Alternatively, the D-Latch 208 may be delay circuitry (e.g., a hold register). A set input terminal or reset input terminal of an SR-Latch may be referred to as an SR-Latch input.

In the example of FIG. 2, the first terminal 202 is coupled to a latch input (IN) of the first strongARM latch 204. A latch clock input of the first strongARM latch 204 is coupled to a clock signal received at the fourth terminal 218, such that the strongARM latch 204 is configured to sample the first terminal 202 on a rising edge of the clock signal received at the fourth terminal 218. A first latch output (OP) of the first strongARM latch 204 is coupled to a set input (S) of the first SR-Latch 206. A second latch (ON) output of the first strongARM latch 204 is coupled to a reset input terminal (R) of the first SR-Latch 206. The first SR-Latch 206 is configured to hold the output of the first strongARM latch 204 at a common mode voltage, such that a SR-Latch output (Q) may represent the value of the second terminal 210 as a result of a falling edge of the clock signal received at the fourth terminal 218. The SR-Latch output (Q) of the first SR-Latch 206 is coupled to a latch input (D) of the D-Latch 208. The D-Latch 208 is configured to sample the SR-Latch output of the first SR-Latch 206 during a rising edge of a latch clock input of the D-Latch 208. The latch clock input of the D-Latch 208 is coupled to the fifth terminal 220 (e.g., the inverted clock signal received at the fifth terminal 220 is 180 degrees out of phase from the clock signal received at the fourth terminal 218). The D-Latch 208 is configured to sample the SR-Latch output of the first SR-Latch 206 on the rising edge of the inverted clock signal received at the fifth terminal 220, such that the D-Latch 208 samples on the falling edge of the clock signal received at the fourth terminal 218. A latch output (Q) of the D-Latch 208 is coupled to the second terminal 210. Alternatively, the clock input of the D-Latch 208 may be configured to sample on a falling edge of the clock signal received at the fourth terminal 218.

The first terminal 202 is coupled to a latch input (IN) of the second strongARM latch 212, such that the second strongARM latch 212 is configured to sample the first terminal 202. A latch clock input of the second strongARM latch 212 is coupled to the fifth terminal 220, such that the second strongARM latch 212 is configured to sample the first terminal 202 on a rising edge of the inverted clock signal received at the fifth terminal 220 (the falling edge of the clock signal received at the fourth terminal 218). A first latch output (OP) of the second strongARM latch 212 is coupled to a set input terminal (S) of the second SR-Latch 214. A second latch output (ON) of the second strongARM latch 212 is coupled to a reset input terminal (R) of the second SR-Latch 214. The second SR-Latch 214 is configured to hold the output of the second strongARM latch 212 at a common mode voltage, such that a SR-Latch output (Q) may represent the value of the third terminal 216 as a result of a rising edge of the inverted clock signal received at the fifth terminal 222. The SR-Latch output (Q) of the second SR-Latch 214 is coupled to the third terminal 216. Alternatively, the latch clock input of the second strongARM latch 212 may be configured to sample on a falling edge of the clock signal received at the fourth terminal 218.

In some examples, the one-to-two strongARM deserializer stage 200 is a single integrated circuit (IC) (such as circuitry implemented on a single semiconductor die or on multiple die but within a single IC package). For example, the first strongARM latch 204 and the second strongARM latch 212 may be included on the same semiconductor die. In some examples, the one to two strongARM deserializer stage 200 may be implemented by two or more ICs in a single IC package to implement a multi-chip module (MCM). In some examples, the one to two strongARM deserializer stage 200 may be implemented by two or more ICs (such as two or more IC packages). For example, the first strongARM latch 204 and the first SR-Latch 206 may be on a first die and the second strongARM latch 212 may be on a second die. In some examples, the first strongARM latch 204 may be on a first die, the D-Latch 208 may be on a second die, and the second strongARM latch 212 may be on a third die.

In example operation, the first terminal 202 is sampled on the rising edge of the clock signal received at the fourth terminal 218 by the first strongARM latch 204. The first strongARM latch 204 generates a CMOS output based on the first terminal 202. The CMOS output is latched into the first SR-Latch 206, such that the common mode voltage may be preserved. The output of the first SR-Latch 206 is sampled by the D-Latch 208 on the rising edge of the inverted clock signal received at the fifth terminal 220 (or the falling edge of the clock signal received at the fourth terminal 218). The latch output of the D-Latch 208 is the second terminal 210.

In example operation, the first terminal 202 is sampled on the rising edge of the inverted clock signal received at the fifth terminal 220 (or the falling edge of the clock signal received at the fourth terminal 218) by the second strongARM latch 212. The second strongARM latch 212 generates a CMOS output based on the input received at the first terminal 202. The CMOS output is latched into the second SR-Latch 214. The latch output of the second SR-Latch 214 is the third terminal 216.

Advantageously, the one-to-two strongARM deserializer stage 200 converts a single CML data stream (e.g., the input received at the first terminal 202) into two parallel CMOS data streams (e.g., the output at the second terminal 210 and the third terminal 216). Advantageously, the parallel CMOS data streams generated by the one-to-two strongARM deserializer stage 200 are at CMOS levels.

In an example embodiment, input 202 represents a single input of inputs 106A, 106B, 106C and/or 106D and outputs d01 and d11 represent two of the 32 outputs 109. In such embodiments, four stages 200 would be used, in parallel, to implement stage 120, 122, 124 or 126 of FIG. 1 with each input 202 representing a different input for inputs 106A, 106B, 106C and/or 106D. Additionally, each of the outputs d01 and d11 would represent a different two outputs of outputs 109.

Figure 3:
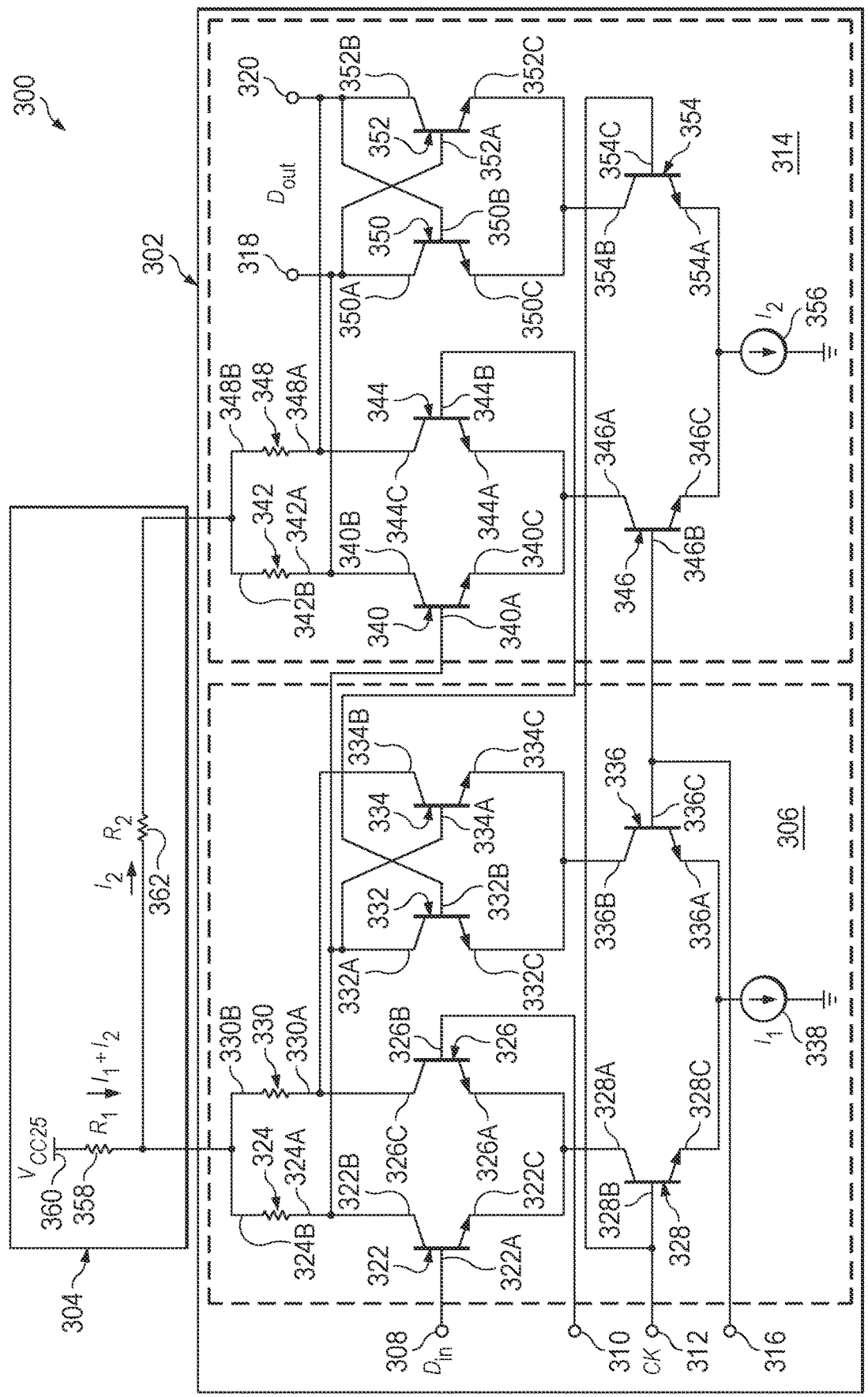
FIG. 3 is a schematic diagram of a flip flop including level shifting circuitry, wherein the common mode output of the level shifting circuitry may be adjusted.

FIG. 3 is a schematic diagram of a flip flop with level shifting circuitry 300, such that the common mode level of the output of the flip flop with level shifting circuitry 300 may be adjusted. The flip flop with level shifting circuitry 300 may be implemented as a one-to-two deserializer stage by replacing the strongARM latches 204 and 212, and SR-Latches 206 and 214 of FIG. 2 with the flip flop with level shifting circuitry 300 to create a one-to-two CMOS-to-CMOS deserializer stage. A plurality of the one-to-two CMOS-to-CMOS deserializer stage may be configured (such that an example clock is configured to sample the input 108 every quarter of a clock cycle) to construct the one-to-four deserializer stages 112-118 of FIG. 1. In the example of FIG. 3, the flip flop with level shifting circuitry 300 includes an example flip flop 302 and an example level shifting circuit 304. Alternatively, the level shifting circuit 304 may be a plurality of voltage sources or regulators, such that the common mode level may be adjusted.

In the example of FIG. 3, the flip flop 302 includes a first D-Latch 306, an example first terminal 308, a second terminal 310, a third terminal 312, a second D-Latch 314, a fourth terminal 316, a fifth terminal 318, and a sixth terminal 320.

A first latch input ($D_{in}$) of the first D-Latch 306 is coupled to the CML data stream received at the first terminal 308. A second latch input of the first D-Latch 306 is coupled to the second terminal 310. The CML data streams received at the terminals 308 and 310 are a differential CML data stream, such that the CML data stream received at the second terminal 310 is a complementary signal of the CML data stream received at the first terminal 308. A first latch clock input of the first D-Latch 306 is coupled to the clock signal received at the third terminal 312. A second latch clock input of the first D-Latch 306 is coupled to the fourth terminal 316. The first D-Latch 306 is configured to sample the CML data stream received at the first terminal 308 as a result of a rising edge on the clock signal received at the third terminal 312. The clock signals received at the terminals 312 and 316 are a differential clock signal, such that the inverted clock signal received at the fourth terminal 316 is a complementary signal of the clock signal received at the third terminal 312 (e.g., the inverted clock signal received at the fourth terminal 316 is 180 degrees out of phase of the clock signal received at the third terminal 312).

A first latch output of the first D-Latch 306 is coupled to a first latch input of the second D-Latch 314. A second latch output of the first D-Latch 306 is coupled to a second latch input of the second D-Latch 314. A first latch clock input of the second D-Latch 314 is coupled to the fourth terminal 316. A second latch clock input of the second D-Latch 314 is coupled to the clock signal received at the third terminal 312. The second D-Latch 314 is configured to sample the outputs of the first D-Latch 306 as a result of a rising edge on the inverted clock signal received at the fourth terminal 316. A first latch output of the second D-Latch 314 is coupled to the fifth terminal 318. A second latch output of the second D-Latch 314 is coupled to the sixth terminal 320. The CML data streams at the terminals 318 and 320 are a differential CML data stream, such that the CML data stream at the sixth terminal 320 is a complementary signal of the CML data steam at the fifth terminal 318.

In the example of FIG. 3, the first D-Latch 306 includes an example first transistor 322, an example first resistor 324, a second transistor 326, a third transistor 328, a second resistor 330, a fourth transistor 332, a fifth transistor 334, a sixth transistor 336, and an example first current source 338. The transistors 322, 326, 328, and 332-336 are n-type/p-type/n-type (NPN) bipolar junction transistors (BJTs). Alternatively, the transistors 322, 326, 328, and 332-336 may be N-channel Metal-oxide-semiconductor field-effect transistors (MOSFET), N-channel field-effect transistors (FET), N-channel insulated-gate bipolar transistors (IGBT), N-channel junction field effect transistors (JFET), P-channel MOSFETs, a P-channel FETs, a P-channel IGBT, a P-channel JFETs, or an PNP BJTs.

In the example of FIG. 3, the first terminal 308 is coupled to a first control terminal 322A of the first transistor 322. A control terminal is a reference to a transistor terminal (e.g., gate terminal, base terminal, etc.) that controls the operation of the transistor and determines if the transistor is enabled. A first current terminal 322B of the first transistor 322 is coupled to a first terminal 324A of the first resistor 324, a first current terminal 332A of the fourth transistor 332, and a control terminal 334A of the fifth transistor 334. A current terminal is a reference to a transistor terminal (e.g., drain terminal, source terminal, emitter terminal, collector terminal, etc.) that allows current to flow either into the transistor or out of the transistor during operation that enables the transistor. A second current terminal 322C of the first transistor 322 is coupled to a first current terminal 326A of the second transistor 326 and a first current terminal 328A of the third transistor 328. The second terminal 310 is coupled to a control terminal 326B of the second transistor 326. A second current terminal 326C of the second transistor 326 is coupled to a first terminal 330A of the second resistor 330, a control terminal 332B of the fourth transistor 332, and a first current terminal 334B of the fifth transistor 334. A second terminal 324B of the first resistor 324 is coupled to a second terminal 330B of the second resistor 330. The third terminal 312 is coupled to a control terminal 328B of the third transistor 328. A second current terminal 328C of the third transistor 328 is coupled to a first current terminal 336A of the sixth transistor 336. A second current terminal 332C of the fourth transistor 332 is coupled to a second current terminal 334C of the fifth transistor 334, and a second current terminal 336B of the sixth transistor 336. The fourth terminal 316 is coupled to a control terminal 336C of the sixth transistor 336. The first current source 338 is coupled between the second current terminal 328C of the third transistor 328 and a common potential (e.g., common ground).

In the example of FIG. 3, the second D-Latch 314 includes a seventh transistor 340, a third resistor 342, an eighth transistor 344, a ninth transistor 346, a fourth example resistor 348, a tenth transistor 350, an eleventh transistor 352, a twelfth transistor 354, and a second current source 356. The transistors 340, 344, 346, and 350-336 are NPN BJTs. Alternatively, the transistors 340, 344, 346, and 350-354 may be N-channel MOSFET, N-channel FET, N-channel IGBT, N-channel JFET, P-channel MOSFETs, a P-channel FETs, a P-channel IGBT, a P-channel JFETs, or an PNP BJTs.

In the example of FIG. 3, the first current terminal 322B of the first transistor 322 is coupled to a first control terminal 340A of the seventh transistor 340. The fifth terminal 318 is coupled to a first current terminal 340B of the seventh transistor 340, a first terminal 342A of the third resistor 342, a first current terminal 350A of the tenth transistor 350, and a control terminal 352A of the eleventh transistor 352. A second current terminal 340C of the seventh transistor 340 is coupled to a first current terminal 344A of the eighth transistor 344 and a first current terminal 346A of the ninth transistor 346. The second current terminal 326C of the second transistor 326 is coupled to a control terminal 344B of the eighth transistor 344. The sixth terminal 320 is coupled to a second current terminal 344C of the eighth transistor 344, a first terminal 348A of the fourth resistor 348, a control terminal 350B of the tenth transistor 350, and a first current terminal 352B of the eleventh transistor 352. A second terminal 342B of the third resistor 342 is coupled to a second terminal 348B of the fourth resistor 348. The fourth terminal 316 is coupled to a control terminal 346B of the ninth transistor 346. A second current terminal 346C of the ninth transistor 346 is coupled to a first current terminal 354A of the twelfth transistor 354. A second current terminal 350C of the tenth transistor 350 is coupled to a second current terminal 352C of the eleventh transistor 352, and a second current terminal 354B of the twelfth transistor 354. The third terminal 312 is coupled to a control terminal 354C of the twelfth transistor 354. The second current source 356 is coupled between the second current terminal 346C of the ninth transistor 346 and a common potential (e.g., common ground).

In the example of FIG. 3, the level shifting circuit 304 includes a fifth example resistor ($R_1$) 358, a first example supply voltage ($V_{CC25}$) 360, and a sixth example resistor ($R_2$) 362. The fifth resistor 358 is coupled between the first D-Latch 306 and the first supply voltage 360. The sixth resistor 362 is coupled between the first D-Latch 306, the fifth resistor 358, and the second D-Latch 314.

In example operation, the first D-Latch 306 samples the CML data stream received at the first terminal 308 on the rising edge of the clock signal received at the third terminal 312. The latch output of the first D-Latch 306 is sampled by the second D-Latch 314 on the rising edge of the inverted clock signal received at the fourth terminal 316. The D-Latches 306 and 314 operate as CML circuits, such that the D-Latches 306 and 314 may operate based on a minimum current requirement. The minimum current requirement for the D-Latches 306 and 314 are determined based on the current sources 338 and 356. To meet the minimum current requirement of each of the D-Latches 306 and 314, a level shifting circuit 304 may be implemented based on the desired common mode of the output and the minimum current required by each of the D-Latches 306 and 314.

In example operation, a first minimum current (the magnitude of the first current source ($I_1$) 338), is supplied to the first D-Latch 306 through the fifth resistor 358. The first minimum current is supplied by the first supply voltage 360 to the first resistor through a first supply output of the level shifting circuit 304. A second minimum current (the magnitude of the second current source ($I_2$) 356), is supplied to the second D-Latch 314 through the resistors 358 and 362 through a second supply output of the level shifting circuit 304. The second minimum current is generated by the first supply voltage 360. The first supply voltage 360 supplies a total current ($I_{VCC}$) that may be determined by the Equation (1) below. The supply voltage ($V_{DD2}$) of the D-Latch 306 may be determined based on Equation (2) below. The fifth resistor 358 shifts the supply voltage of the first D-Latch 306 based on the multiplication of $I_{VCC}$ and $R_1$, such that the latch output of the first D-Latch 306 is also shifted. The supply voltage ($V_{DD3}$) of the D-Latch 314 may be determined based on Equation (3) below. The sixth resistor 362 shifts the supply voltage of the second D-Latch 314 based on the addition of the multiplication of $I_{VCC}$ and $R_1$ and the multiplication of $I_2$ and $R_2$, such that the output of the second D-Latch 314 is also shifted.

$$I_{VCC}=I_1+I_2, \quad \text{Equation (1)}$$

$$V_{DD2}=V_{CC25}-(I_{VCC}*R_1), \quad \text{Equation (2)}$$

$$V_{DD3}=V_{CC25}-(I_{VCC}*R_1)-(I_2*R_2), \quad \text{Equation (3)}$$

Advantageously, the level shifting of the supply voltage of D-Latches 306 and 314 enables the common mode of the CML data streams at the terminals 318 and 320 to be shifted without affecting the operation of the flip flop 302. Advantageously, the first supply voltage 360, the fifth resistor 358 and the sixth resistor 362 may be determined by Equation (1), Equation (2), and Equation (3), above. Advantageously, the CML data signals at the terminals 318 and 320 have a lower common mode level compared to the CML data streams received at the terminals 308 and 310.

Figure 4:
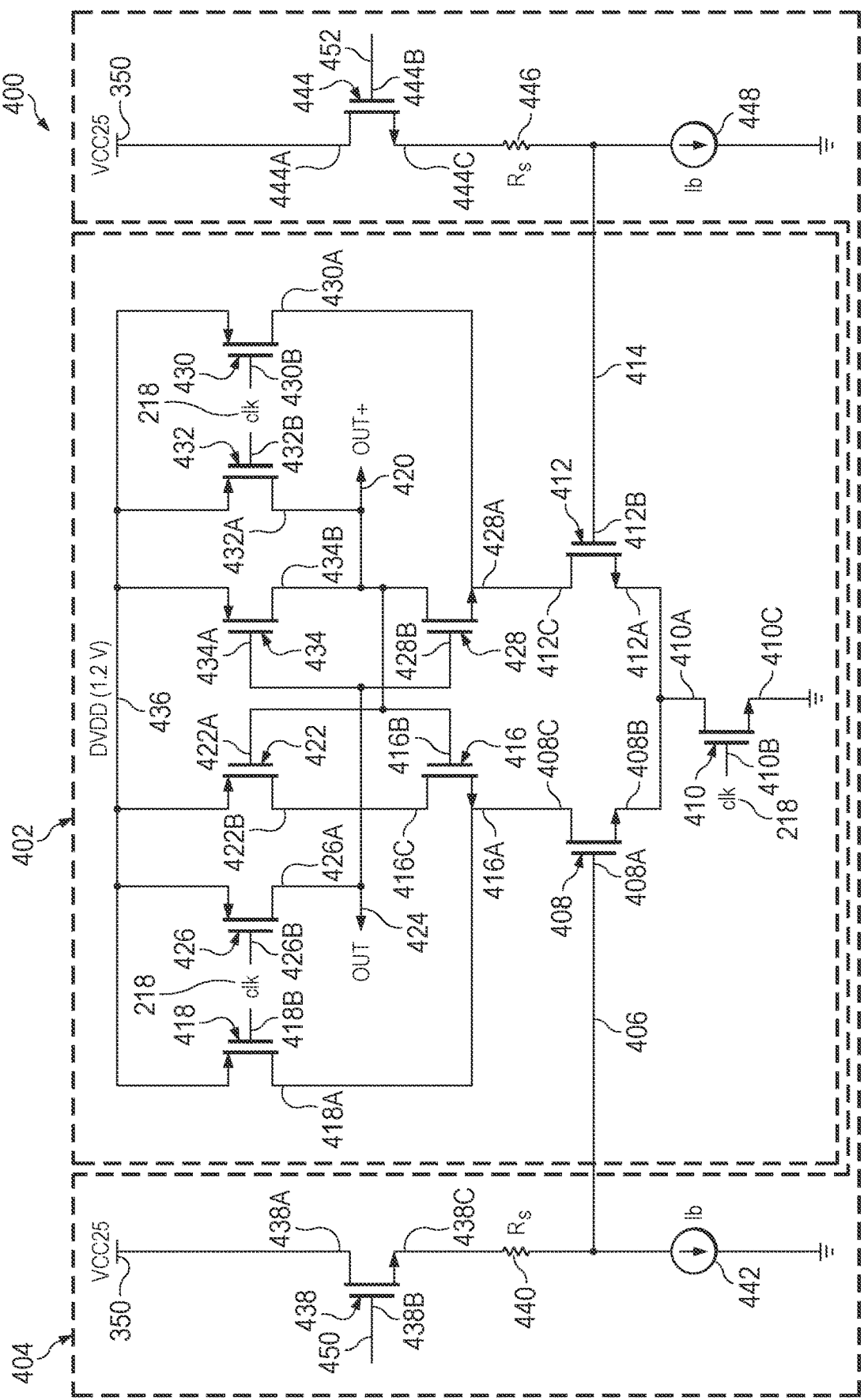
FIG. 4 is a schematic diagram of a CML-to-CMOS latch including input level shifters.

FIG. 4 is a schematic diagram of a strongARM latch with input level shifters 400. In the example of FIG. 4, the strongARM latch with input level shifters 400 includes an example strongARM latch 402 and an example input level shifting circuit 404. Alternatively, the input level shifting to convert the common mode level of a CML data stream may be implemented by the input level shifting circuit 404 and/or the level shifting circuitry 300 of FIG. 3. In some example embodiments, circuit 400 of FIG. 4 (with or without level shifters 404) may be used to implement latches 204 and/or 212 (FIG. 2).

In the example of FIG. 4, the strongARM latch 402 includes the clock signal (clk), which may be the same as clock signal CK shown in FIG. 2 and FIG. 3, received at the fourth terminal 218. In addition, strongARM latch 402 includes an example first input terminal 406, an example first transistor 408, a second transistor 410, a third transistor 412, a second input terminal 414, a fourth transistor 416, a fifth transistor 418, a third terminal 420, a sixth transistor 422, a fourth terminal 424, a seventh transistor 426, an eighth transistor 428, a ninth transistor 430, a tenth transistor 432, an eleventh transistor 434, and a second example supply voltage 436. The transistors 408-412, 416, and 428 are N-channel MOSFETs. Alternatively, the transistors 408-412, 416, and 428 may be, N-channel FETs, N-channel IGBTs, N-channel JFETs, NPN BJTs, P-channel MOSFETs, a P-channel FETs, a P-channel IGBTs, a P-channel JFETs, or PNP BJTs. The transistors 418, 422, 426, and 430-434 are P-channel MOSFETs. Alternatively, the transistors 418, 422, 426, and 430-434 may be, N-channel FETs, N-channel IGBTs, N-channel JFETs, NPN BJTs, N-channel MOSFETs, a P-channel FETs, a P-channel IGBTs, a P-channel JFETs, or PNP BJTs. Example data stream inputs may be received at the terminals 406 and 414 are a differential pair of inputs. A drain terminal and/or a source terminal may be referred to as a current terminal. A gate terminal may be referred to as a control terminal.

In the example of FIG. 4, the first terminal 406 is coupled to a control terminal 408A of the first transistor 408. A first current terminal 408B of the first transistor 408 is coupled to a first current terminal 410A of the second transistor 410 and a first current terminal 412A of the third transistor 412. A control terminal 410B of the second transistor 410 is coupled to the fourth terminal 218. A second current terminal 410C of the second transistor 410 is coupled to common potential (e.g., ground). A control terminal 412B of the third transistor 412 is coupled to the second terminal 414. A second current terminal 408C of the first transistor 408 is coupled to a first current terminal 416A of the fourth transistor 416 and a first current terminal 418A of the fifth transistor 418. A control terminal 418B of the fifth transistor 418 is coupled to the fourth terminal 218. A control terminal 416B of the fourth transistor 416 is coupled to the third terminal 420 and a control terminal 422A of the sixth transistor 422. A second current terminal 416C of the fourth transistor 416 is coupled to a first current terminal 422B of the sixth transistor 422, the fourth terminal 424, and a first current terminal 426A of the seventh transistor 426. The fourth terminal 218 is additionally coupled to a control terminal 426B of the seventh transistor 426.

In the example of FIG. 4, a second current terminal 412C of the third transistor 412 is coupled to a first current terminal 428A of the eighth transistor 428 and a first current terminal 430A of the ninth transistor 430. The fourth terminal 218 is additionally coupled to a control terminal 430B of the ninth transistor 430. The fourth terminal 424 is additionally coupled to a control terminal 428B of the eighth transistor 428 and a control terminal 434A of the eleventh transistor 434. The third terminal 420 is additionally coupled to a second current terminal 428C of the eighth transistor 428, a first current terminal 432A of the tenth transistor 432, and a first current terminal 434B of the eleventh transistor 434. The fourth terminal 218 is additionally coupled to a control terminal 432B of the tenth transistor 432. A second current terminal 418C of the fifth transistor 418 is coupled to a second current terminal 422C of the sixth transistor 422, a second current terminal 426C of the seventh transistor 426, a second current terminal 430C of the ninth transistor 430, a second current terminal 432C of the tenth transistor 432, a second current terminal 434C of the eleventh transistor 434, and the second supply voltage ($DV_{DD}$) 436.

In the example of FIG. 4, the input level shifting circuit 404 includes the first supply voltage ($V_{CC25}$) 350, a twelfth transistor 438, an example first resistor 440, an example first current source 442, a thirteenth transistor 444, a second resistor 446, a second current source 448, a fifth terminal 450, and a sixth terminal 452. A CML data stream received at the fifth terminal 450 and the CML data stream received at the sixth terminal 452 are a differential pair of inputs In the example of FIG. 4, the first supply voltage 350 is coupled to a first current terminal 438A of the twelfth transistor 438 and a first current terminal 444A of the thirteenth transistor 444. A control terminal 438B of the twelfth transistor 438 is coupled to the fifth terminal 450. A second current terminal 438C of the twelfth transistor 438 is coupled to the first resistor 440. The first current source 442 is coupled between the first resistor 440 and common potential (e.g., ground). The first terminal 406 is coupled between the first resistor 440 and the first current source 442. A control terminal 444B of the thirteenth transistor 444 is coupled to the sixth terminal 452. A second current terminal 444C of the thirteenth transistor 444 is coupled to the second resistor 446. The second current source 448 is coupled between the second resistor 446 and common potential (e.g., ground). The second terminal 414 is coupled between the second resistor 446 and the second current source 448.

In some examples, the strongARM latch with input level shifters 400 is a single integrated circuit (IC) (such as circuitry implemented on a single semiconductor die or on multiple die but within a single IC package). For example, the strongARM latch 402 and the input level shifting circuit 404 may be included on the same semiconductor die. In some examples, the strongARM latch with input level shifters 400 may be implemented by two or more ICs in a single IC package to implement a multi-chip module (MCM). In some examples, the strongARM latch with input level shifters 400 may be implemented by two or more ICs (such as two or more IC packages). For example, the strongARM latch 402 may be on a first die and the input level shifting circuit 404 may be on a second die. Alternatively, one or more hardware circuit components (such as the transistors 408-418, etc.) of the strongARM latch 402 may be included in the input level shifting circuit 404. Alternatively, one or more hardware circuit components (such as the current sources 442 and 448, etc.) of the input level shifting circuit 404 may be included in the strongARM latch 402.

In example operation, the CML data streams received at the terminals 450 and 452 are an example differential output of the flip flop with level shifting circuitry 300 of FIG. 3. The CML data streams received at the terminals 450 and 452 may configured to be a differential output of the one-to-four deserializer stages 112-118. The common mode level of the output of the flip flop with level shifting circuitry ($V_{CMO}$) 300 of FIG. 3 is determined in Equation (3) as $V_{DD3}$. The voltage of the control terminal 438B of the twelfth transistor 438 minus the voltage of the second current terminal 438C of the twelfth transistor 438 is the gate to source voltage of the twelfth transistor ($V_{GS12}$) 438. The input level shifting circuit 404 is configured to shift the common mode voltage output ($V_{CMO}$) of a CML deserializer (e.g., the flip flop with level shifting circuitry 300 of FIG. 3, etc.) from the CML data stream received at the fifth terminal 450 to a common mode voltage input ($V_{CMI}$) from the first terminal 406, such that the strongARM latch 402 may output a CMOS data stream at the third terminal 420 at a CMOS logic level. The common mode voltage level of the data stream received at the first terminal 406 may be determined based on the subtraction of $V_{GS12}$ and the multiplication of a magnitude of the first current source ($I_{b1}$) 442 and a magnitude of the first resistor ($R_{S1}$) 440 from $V_{CMO}$. The common mode voltage level $V_{CMI}$ of the first data stream input received at the first terminal 406 may be determined based on Equation (4), below. The voltage of the control terminal 444B of the thirteenth transistor 444 minus the voltage of the second current terminal 444C of the thirteenth transistor 444 is the gate to source voltage of the thirteenth transistor ($V_{GS13}$) 444. The common mode voltage level of the data stream received at the second terminal 414 may be determined based on the subtraction of $V_{GS13}$ and the multiplication of a magnitude of the second current source ($I_{b2}$) 448 and a magnitude of the second resistor ($R_{S2}$) 446 from $V_{CMO}$. The common mode voltage $V_{CMI}$ of the second data stream received at the second terminal 414 may be determined based on Equation (5), below.

$$V_{CMI}=V_{CMO}-V_{GS12}-(I_{b1}*R_{S1}), \quad \text{Equation (4)}$$

$$V_{CMI}=V_{CMO}-V_{GS13}-(I_{b2}*R_{S2}), \quad \text{Equation (5)}$$

In example operation, the values of $I_{b1}$, $I_{b2}$, $R_{S1}$, and $R_{S2}$ are configured based on Equation (4) and Equation (5), such that the $V_{CMI}$ of the data stream inputs received at the terminals 406 and 414 are equal to $DV_{DD}$ of the strongARM latch 402. The input level shifting circuit 404 is configured to convert the common mode voltage level of a CML data stream to a common mode voltage level that the strongARM latch 402 may output a CMOS data stream. Advantageously, the input level shifting circuit 404 adjusts the common mode voltage level of the CML data streams received at the terminals 450 and 452 to a level that allows the strongARM latch 402 to output the CMOS data stream outputs at the terminals 420 and 424 as a CMOS signal.

Figure 5:
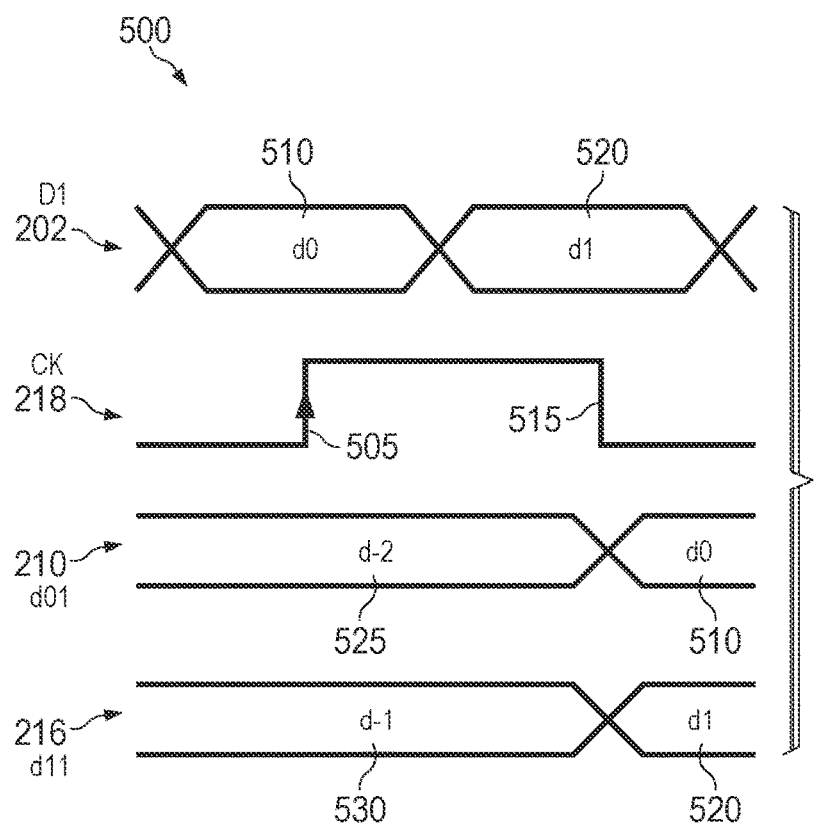
FIG. 5 is an example timing diagram of deserialization including data samples on the rising and falling edges of the clock.

FIG. 5 is an example timing diagram 500 of the one-to-two strongARM deserializer stage 200 of FIG. 2 including data samples on the rising and falling edges of the clock. The timing diagram 500 represents a sample operation of the one-to-two strongARM deserializer stage 200. In the example of FIG. 5, the timing diagram 500 includes timing samples of the CML data stream (D1) received at the first terminal 202 of FIG. 2, the first CMOS data stream (d01) 210, the second CMOS data stream (d11) at the third terminal 216, and the clock signal (CK) received at the fourth terminal 218. The first terminal 202 may be the fifth terminal 318 of FIG. 3. Alternatively, the timing diagram 500 depicts a conventional one to two deserialization.

In the example of FIG. 5, the first terminal input 202 is the combination of two lower speed data streams (e.g., the CMOS data streams at the terminals 210 and 216). The strongARM latches 204 and 212 of FIG. 2 sample the first terminal 202 based on the clock signal received at the fourth terminal 218. The first strongARM latch 204 is configured to sample the first terminal 202 based on detecting a rising edge 505 on the clock signal received at the fourth terminal 218, such that a first digital value (d0) 510 is latched. The second strongARM latch 212 of FIG. 2 is configured to sample the first terminal 202 based on detecting a falling edge 515 of the clock signal received at the fourth terminal 218, such that a second digital value (d1) 520 is latched. The CMOS data streams at the terminals 210 and 216 are configured to update as the result of the falling edge 515 of the clock signal received at the fourth terminal 218. The first strongARM latch 204 of FIG. 2 is coupled to the D-Latch 208, such that the output at the second terminal 210 updates as a result of the falling edge 515 of the clock signal received at the fourth terminal 218. The second terminal 210 is configured to update from a first previous digital value (d-2) 525 to the first digital value 510. The terminal 216 is configured to update from a first previous digital value (d-1) 530 to the first digital value 520.

Various forms of the term "couple" are used throughout the specification. These terms may cover connections, communications, or signal paths that enable a functional relationship consistent with the description of the present disclosure. For example, if device A generates a signal to control device B to perform an action, in a first example device, A is coupled to device B by direct connection, or in a second example device, A is coupled to device B through intervening component C if intervening component C does not alter the functional relationship between device A and device B such that device B is controlled by device A via the control signal generated by device A.

Consistent with the present disclosure, the term "configured to" describes the structural and functional characteristics of one or more tangible non-transitory components. For example, a device that is "configured to" perform a function mean that the device has a particular configuration that is designed or dedicated for performing a certain function. A device is "configured to" perform a certain function if such a device includes tangible non-transitory components that can be enabled, activated, or powered to perform that certain function. While the term "configured to" may encompass being configurable, this term is not limited to such a narrow definition. Thus, when used for describing a device, the term "configured to" does not require the described device to be configurable at any given point of time.

Moreover, the term "example" is used herein to mean serving as an instance, illustration, etc., and not necessarily as advantageous. Also, although the disclosure has been shown and described with respect to one or more implementations, equivalent alterations and modifications will be apparent upon a reading and understanding of this specification and the annexed drawings. All such modifications and alterations are fully supported by the disclosure and is limited only by the scope of the following claims. In particular regard to the various functions performed by the above-described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in an example particular order, this does not require that such operations be performed in the example particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above does not require such separation in all embodiments.

Descriptors "first," "second," "third," etc. are used herein when identifying multiple elements or components which may be referred to separately. Unless otherwise specified or understood based on their context of use, such descriptors do not impute any meaning of priority, physical order, or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device, other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Further-more, the devices may be implemented in/over a silicon substrate (Si), a silicon carbide substrate (SiC), a gallium nitride substrate (GaN) or a gallium arsenide substrate (GaAs).

While the discussion above suggests that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

The following claims are hereby incorporated into this Detailed Description by this reference, with each claim standing on its own as a separate embodiment of the present disclosure.

What is claimed is:

1. An apparatus comprising:
   a first latch including a first latch input, a first latch clock input, and a first latch output, the first latch input coupled to a data input, the first latch clock input coupled to a first clock input;
   a first SR-Latch including a first SR-Latch input and a first SR-Latch output, the first SR-Latch input coupled to the first latch output;
   a second latch including a second latch input, a second latch clock input, and a second latch output, the second latch input coupled to the data input, the second latch clock input coupled to a second clock input;
   a second SR-Latch including a second SR-Latch input, the second SR-Latch input coupled to the second latch output; and
   a third latch including a third latch input and a third latch clock input, the third latch input coupled to the first SR-Latch output, the third latch clock input coupled to the second clock input.

2. The apparatus of claim 1, wherein the first latch is a strongARM latch.

3. The apparatus of claim 1, wherein the second latch is a strongARM latch.

4. The apparatus of claim 1, wherein the third latch is a D-Latch.

5. The apparatus of claim 1, wherein the first latch includes a second output coupled to a second input of the first SR-Latch.

6. The apparatus of claim 1, wherein the second latch includes a second output coupled to a second input of the second SR-Latch.

\* \* \* \* \*